United States Patent [19]
Sheppard

[11] Patent Number: 5,644,579
[45] Date of Patent: Jul. 1, 1997

[54] BI-DIRECTIONAL DATA TRANSFER SYSTEM ENABLING FORWARD/REVERSE BIT SEQUENCES

[75] Inventor: David William Sheppard, Mission Viejo, Calif.

[73] Assignee: Unisys Corporation, Blue Bell, Pa.

[21] Appl. No.: 363,424

[22] Filed: Dec. 22, 1994

[51] Int. Cl.[6] .................................................. G01R 31/28
[52] U.S. Cl. .................. 371/22.3; 371/22.1; 395/183.01
[58] Field of Search .............................. 371/22.3, 25.1, 371/22.1; 395/575, 425; 364/200, 280.2; 324/73 R, 73 AT

[56] References Cited

U.S. PATENT DOCUMENTS

| | | | |
|---|---|---|---|
| 4,710,933 | 12/1987 | Powell et al. ........................ | 371/25 |
| 4,932,028 | 6/1990 | Katircioglu et al. ................. | 371/16.5 |
| 4,975,831 | 12/1990 | Nilsson et al. ...................... | 364/200 |
| 5,001,713 | 3/1991 | Whetsel .............................. | 371/22.3 |
| 5,056,093 | 10/1991 | Whetsel .............................. | 371/22.3 |
| 5,157,781 | 10/1992 | Harwood et al. .................... | 395/575 |
| 5,307,475 | 4/1994 | Lau ..................................... | 395/425 |
| 5,404,463 | 4/1995 | McGarvey ........................... | 395/325 |

*Primary Examiner*—Robert W. Bearsoliel, Jr.
*Assistant Examiner*—Nadeem Iqbal
*Attorney, Agent, or Firm*—Alfred W. Kozak; Mark T. Starr; Steven R. Petersen

[57] ABSTRACT

A maintenance interface system for testing the Logic states of circuitry in digital modules provides for selecting a snake data path and using its control to Write into or to Read out in a forward sequence or selectively in a reverse sequence.

9 Claims, 5 Drawing Sheets

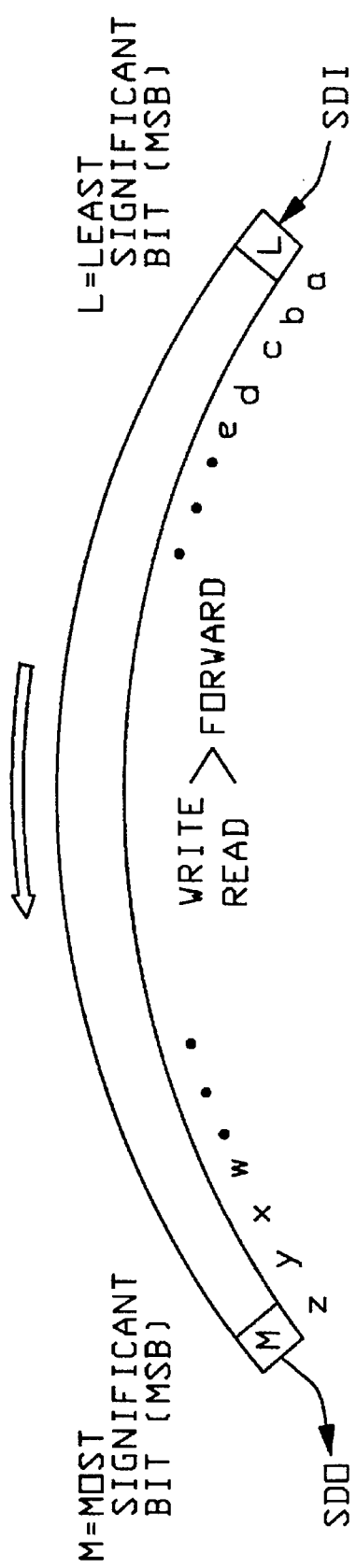
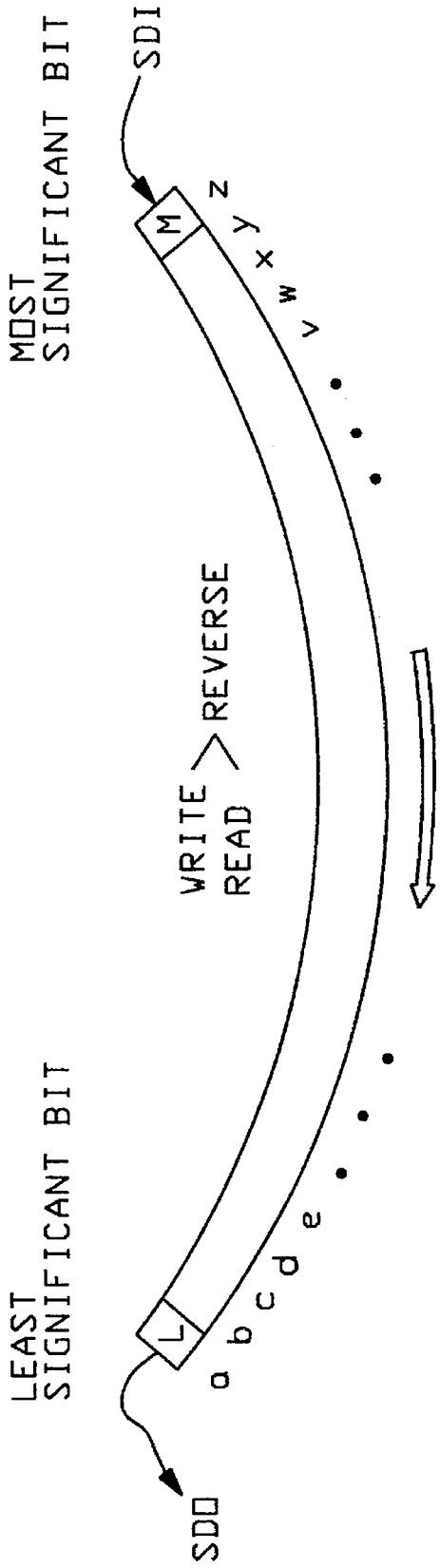
FIG. 3A
FIG. 3B

BI-DIRECTIONAL DATA TRANSFER SYSTEM ENABLING FORWARD/REVERSE BIT SEQUENCES

FIELD OF THE INVENTION

This disclosure relates to systems for data transfer operations between digital modules where arrangements are provided for transferring characters of data in a normal sequential direction or in a reverse sequential direction according to which direction is desired.

BACKGROUND OF THE INVENTION

Referring to FIG. 5, there is seen a generalized block diagram of the overall elements of a computer system having architectural elements designated as a Bus Exchange Module, a Central Processing Module, and I/O Module, Maintenance Interface Hardware, a Memory Interface Unit, a Modular System Memory, a System Control Module and a System Control Processor. This architecture is typical of the Unisys Corporation A Series computer system designated as the A-14. The following acronyms will be used in the discussion of the subject matter:

| | |
|---|---|
| BEM: | Bus Exchange Module |
| CPM: | Central Processing Module |
| IOM: | I/O Module |
| MI: | Maintenance Interface Hardware |
| MIU: | Memory Interface Unit |
| MSM: | Modular System Memory |
| SCM: | System Control Module |
| SCP: | System Control Processor |

The maintenance logic (MI) of the described computer system can be categorized in three classes:

(1) The core maintenance logic implemented in three Xilinx LCAs (Logic Control Array) and their auxiliary circuitry.

(2) All the logic built into individual chips on the logic boards (such as CPUs, memory controllers, buffers, etc.) that decode and/or otherwise facilitate access of the internal chip state (may also include "JTAG" circuitry).

(3) Any auxiliary circuitry needed to interface the above classes (1) and (2) such as decoders, switches, lights, and snakes, etc.

Core Logic

The core logic of the Maintenance Interface Hardware (MI) is implemented on the SCM card (System Control Module). The SCM card is a EISA PC bus compatible card and plugs directly into any PC motherboard accepting such boards.

Chip Requirements

Individual chips (such as $70_a$, $70_b$, $70_c$ of FIG. 4) carry a certain set of circuitry on-board to facilitate access of the chip logic internal state, usually done by using a serial path (snake). This can be something as simple as decoder to route a shift signal to various internal snakes and a multiplexer to select one of several internal snakes to deliver to the outside world.

Increasingly, types of chips are being equipped with "Standard Test Access Port and Boundary-Scan Architecture" usually designated with the name JTAG. The JTAG specification defines a specific set of minimum required functions that provide access to at least the boundaries of a chip. It allows and specifies means for accessing all states and for automatic self-testing. It is described in IEEE Specification 1149.1.

Maintenance Logic-Purpose

The purpose of the maintenance logic in the described system is similar to that of the maintenance logic 15, FIG. 5, of other systems. That is to say, it must provide the connections and data necessary to access all settable and observable logical states in the system (single systems or dual systems) and it must monitor all necessary signals and report any anomalies to the SCP (System Control Processor). The state of the system must be observable while it is running and the Maintenance Interface Hardware 15, FIG. 3, (MI) must be able to access it without harming the running state.

The Maintenance Interface 15, FIG. 3 is implemented in three Xilinx XC-4005 FPGA devices. These LCAs generally operate under the conditions of five volts DC and 16 MHz clock frequency.

EISA Bus Interface

The maintenance hardware 15, FIG. 5, is accessed from the EISA bus and thus, must decode various signals from it to enable it to react to the commands coming from it. Basically, here, five operations are performed: Writing and reading I/O, writing and reading memory, and also asserting as interrupt signals.

All access to "status" from the A Series computer is done through the EISA bus with either I/O or Memory instructions of the host microprocessor in the PC of FIG. 5. Decoding is done on the SCM board to distinguish and individualize each access to the hardware.

I/O Operation

All low-level operations are performed by using I/O operations. These are generated by the host microprocessor using I/O instructions, such as IN, OUT, etc.

EISA-To-Maintenance Bus

Between EISA LCA and the Shift LCA and the Memory LCAs, another bus is provided. It is mainly a copy of the original EISA bus with a few exceptions. Also, on this bus is switching and buffering mechanisms that allows the EISA LCA to access either the local or the remote Shift and Memory LCAs.

Module Maintenance Bus

The maintenance bus seen by any module consists of twelve unidirectional lines, which may be grouped as follows:

| M1: Module and Snake Addressing SCM-MODSEL_B_1 two encoded lines to select a module for a shifting operation | |
|---|---|
| Module Name | Encoding |
| CPM | 0 |
| MIU | 1 |
| MSM | 2 |
| BEM | 3 |

| M2: Module ID Encodings SCM-SNAKE-0-3: four encoded lines to select a snake within a module for a shifting operation | |
|---|---|
| Snake Name | Encoding |
| Snakes 0–12 | 0000–1100 |
| Switches | 1101 |
| Lights | 1110 |
| Snake 15 | 1111 |

Serial Data and Shift Control

The following acronyms and signals are used in shifting and accessing data:

| | |
|---|---|
| SCM-SHIFTB | Active low signal is used to command the selected module to shift the selected snake; the signal is asserted and removed for each bit to shift. |
| SCM-SHACK-B | Active low signal indicating that the selected module is currently shifting the selected snake after which time the SCM-SHIFTB signal is removed in preparing for the next bit; this signal is sampled after SCM-SHIFTB signal is asserted. |
| SCM-SDO | Serial data from the selected snake on a selected module; this is sampled one clock after the SCM-SHIFTB signal is asserted and before the module has a chance to change it. |
| SCM-SDI | Serial data to the selected snake on the selected module; this signal is validated at the same edge as when the SCM-SHIFTB is asserted. |
| System Reset Control: | |
| SCM-RESET | Active low signal that resets the selected module. |
| Module Notification Information: | |
| MI-INTB | Active low signal that is the "wire-or" of the interrupt signals from each module. |

Once a module and one of its snakes has been selected, the MI (Maintenance Interface Hardware) controls shifting the data into or out of the selected snake by controlling the shift signal. The module controls the shifting speed by using the acknowledge signal. The fastest that a snake can be shifted is one bit every two clocks, when the SCM_SHACK_B is held active. When the SCP has finished accessing the state, it may then deselect the module.

The Maintenance Interface 15 (MI) may select a module and issue a reset for that module only. Should the module choose to implement "notification", it will implement one or more "lights" in a separate snake. One or more of these "lights" will be combined to generate a Module Notification Signal to the MI (Maintenance Interface Hardware) by using the interrupt signal. The signal will turn on a SCM "light" which is monitored by the program in the SCP (System Control Processor).

Memory Interface

The Maintenance Interface (MI) Logic 15 provides a sliding window for accessing any physical location in the MSM local rack's Memory. This mechanism allows rapid memory accessing to facilitate the loading of Channel Adapter microcode, boot code, or for testing memory for maintenance. The sliding window parallels the Memory Bus and provides the "address/command" and the data registers addressed through the EISA interface to achieve this high speed access.

When activated, the MI logic allows the SCP (System Control Processor) to Read or to Write a memory location by writing to the COMMAND-3 Register and reading from the MBUSnn-nn Registers on the SCM (System Control Module) for a Read. During a Write operation, the SCP writes into the COMMAND-3 Register and then into MBUSnn-nn Registers with information to be store into the MSM memory (FIG. 3).

Each memory access cycle consists of two phases: The command/address phase and the data phase.

The SCP (System Control Processor) may access any physical location in the MSM memory (FIG. 3) by using the Memory Address and Memory Command Registers in the Maintenance Interface Hardware 15 (MI). The Maintenance Interface Memory Logic provides an additional feature. If multiple Reads or Writes or multiple consecutive memory address is desired, this feature automatically increments the address and issues another memory command after the high-order byte of the data register is accessed. This reduces the number of instructions a program needs to execute a Read or to Write a contiguous block of computer memory.

Signals

The following signals are used to accomplish the MSM Memory Write operations.

| | |
|---|---|
| MI-REQUEST-B | Active signal indicating that SCP wishes to access E-mode memory via the memory bus. |
| MI-CMDVLD-B | When asserted, (low) indicates that the Maintenance Interface (MI) 15 is initiating a memory operation. This is asserted during the command phase of the operation and will remain asserted until the MI receives PMC-CMDV-B as = "0" from the memory controller. This signal will be asserted for a minimum of one clock. |
| MI-DATVLD-B | During Memory Write operation, this signal is asserted during both the command/address and the data phases of the operation. This signal is asserted for exactly two clock periods once the signal PMC-CMDV-B signal is observed to be low. |
| PMC-CMDV-B | This signal is sensed by the Maintenance Interface (MI) 15 indicating the acknowledgement of the command. This causes the data phase to begin. |
| MBUS | During the command/address phase, the memory bus, FIG. 5, is driven by the Maintenance Interface (MI) 15 and contains the command and address; during the two clock data phase this contains data for the modular system memory (MSM). The Memory Maintenance Interface logic, MIU, FIG. 5, sends two signals and receives two signals to control the memory cycles. |

SUMMARY OF THE INVENTION

The present invention involves a cooperative system between a personal computer and a Maintenance Interface Logic Module connected by an EISA bus. Data residing in the personal computer memory can be transferred over the EISA bus to a snake buffer in the Maintenance Interface Logic Module by means of a Shift Interface Control Logic Module. The Shift Interface Control Logic Module functions to manipulate the snake data input and the snake data output sequence of characters to enable the sequence to be accessed in a forward or in a reverse direction without need to using a program to accomplish the desired sequence.

The Shift Interface Control Logic in the Maintenance Interface Module can select snake data from any one of multiple chips holding snake data peculiar to that chip in addition to providing for control of such snake data to be Read or to be written to a "forward" or "reverse" directional sequence.

BRIEF DESCRIPTION OF THE DRAWINGS

FIG. 3A is a schematic drawing showing the transfer of snake data from input to output in a forward direction while FIG. 3B shows the sequence of snake data transfer in the reverse direction from input to output;

GENERAL OVERVIEW

Shift Chain Interface

Figure 1:
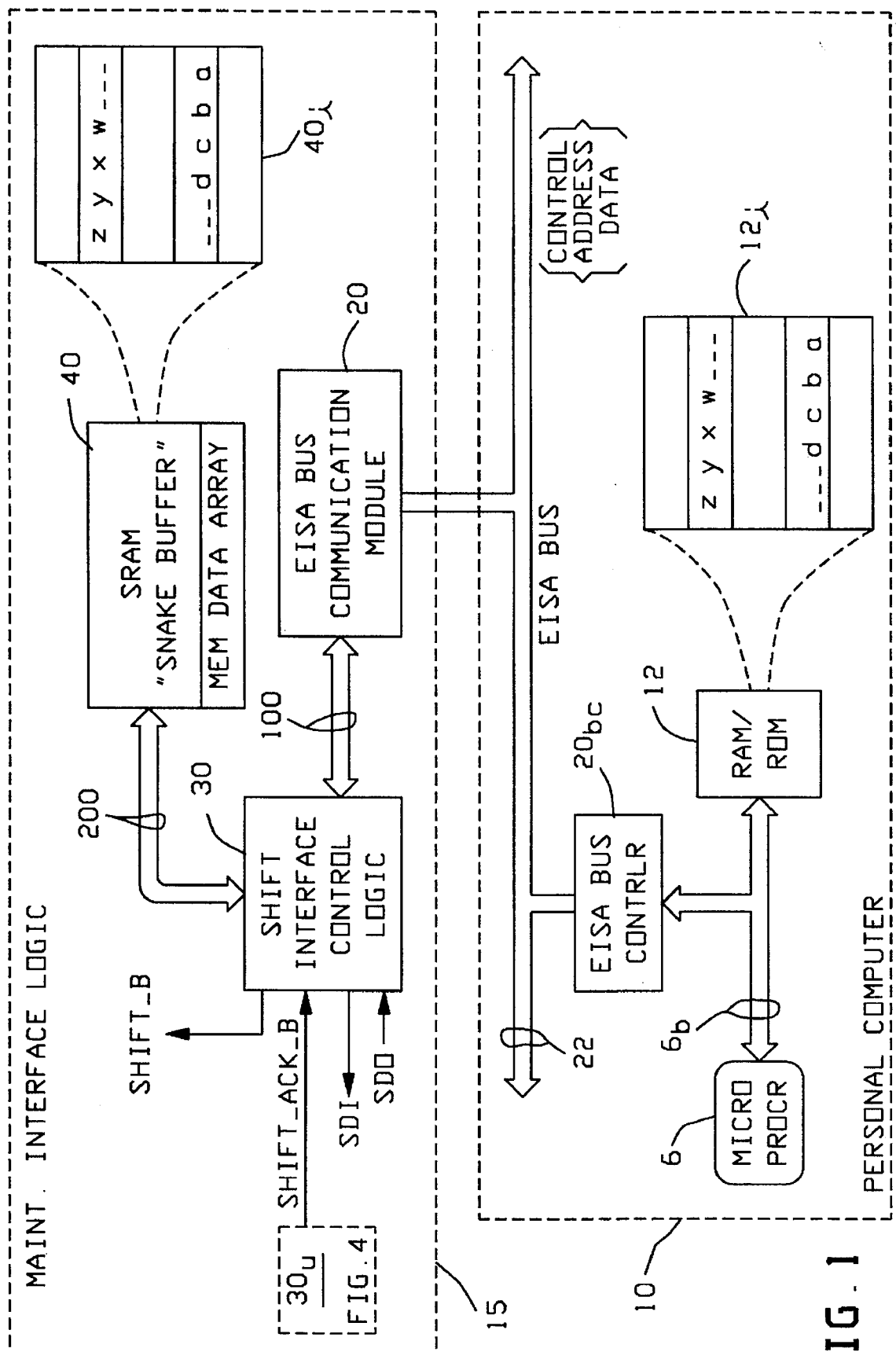
FIG. 1 is a diagram showing the elements of a personal computer having a EISA bus connected to a Maintenance Interface Logic Module.

The Shift Chain Interface Control Logic 30, FIG. 1, 2, of the Maintenance Interface Hardware 15 (MI) accomplishes the goal of accessing the port of the system that exists as a "shift chain". This also includes access of the state inside a IEEE Std. 1149.1-1990 compatible port.

The requirements of the "Shift Chain Interface" of the Maintenance Interface Hardware include the accessing state in either a forward or a reverse direction, reading non-destructively, and accessing the state with the greatest possible speed and with a minimum of data translation on the part of the SCP software.

Shift Chain Signals

The following signals are used to accomplish shift chain operations.

| | |
|---|---|
| SHF-MOD-B | When low, signals the receiver that a bit should be shifted. |
| SHF-ACK-B | When low, indicates that the receiver is shifting a bit of its selected snake. |
| SDI | Serial data to the snake selected for shifting (input). |
| SDO | Serial data out from the snake selected for shifting. |
| MOD-SEL | Two-bit field which selects a module for shifting. |
| CHIP-SEL | Four-bit field which selects a snake within a module for shifting. |

Shift Operations

A software flow of operation is required for executing the shift chain circuit. Hardware is used to accomplish the shift chain operation.

One group of steps are required to "Write" a Shift Signal chain. These include seven separate steps.

Similarly a number of steps are required to "Read" a Shift Signal chain. These steps are discussed hereinafter.

Shift Signal Operation

After the COMMAND-2 Register has been written with a signal SH-ACTIVE=1, the hardware will move into action according to a selected sequence.

On the first clock of this operation, the hardware asserts the signal SHF-MOD-B (low). If the shift operation, is "Write", then valid data to be shifted into the selected snake is also presented on SDI.

If the shift operation is "Read", then the data observed on SDO is asynchronously routed to SDI. This effects a rotation of the selected snake on a Read operation, thereby causing the Read operation to be non-destructive.

On the next clock, the hardware "reads in" the SDO from the selected snake. (If the shift operation is a Write, then the data read from SDO at this point is discarded). At this point also, the SHF-ACK-B signal is tested. If it is inactive (high), then the signal SHF-MOD-B is held active (low). This cycle will repeat until the signal SHF-ACKB is detected active (low). (SDO is not re-read.)

Once the signal SHF-ACK-B is detected as active (low), then the signal SHF-MOD-B is de-asserted (high) for one clock and the whole process is repeated until the operation is complete.

Figure 5:
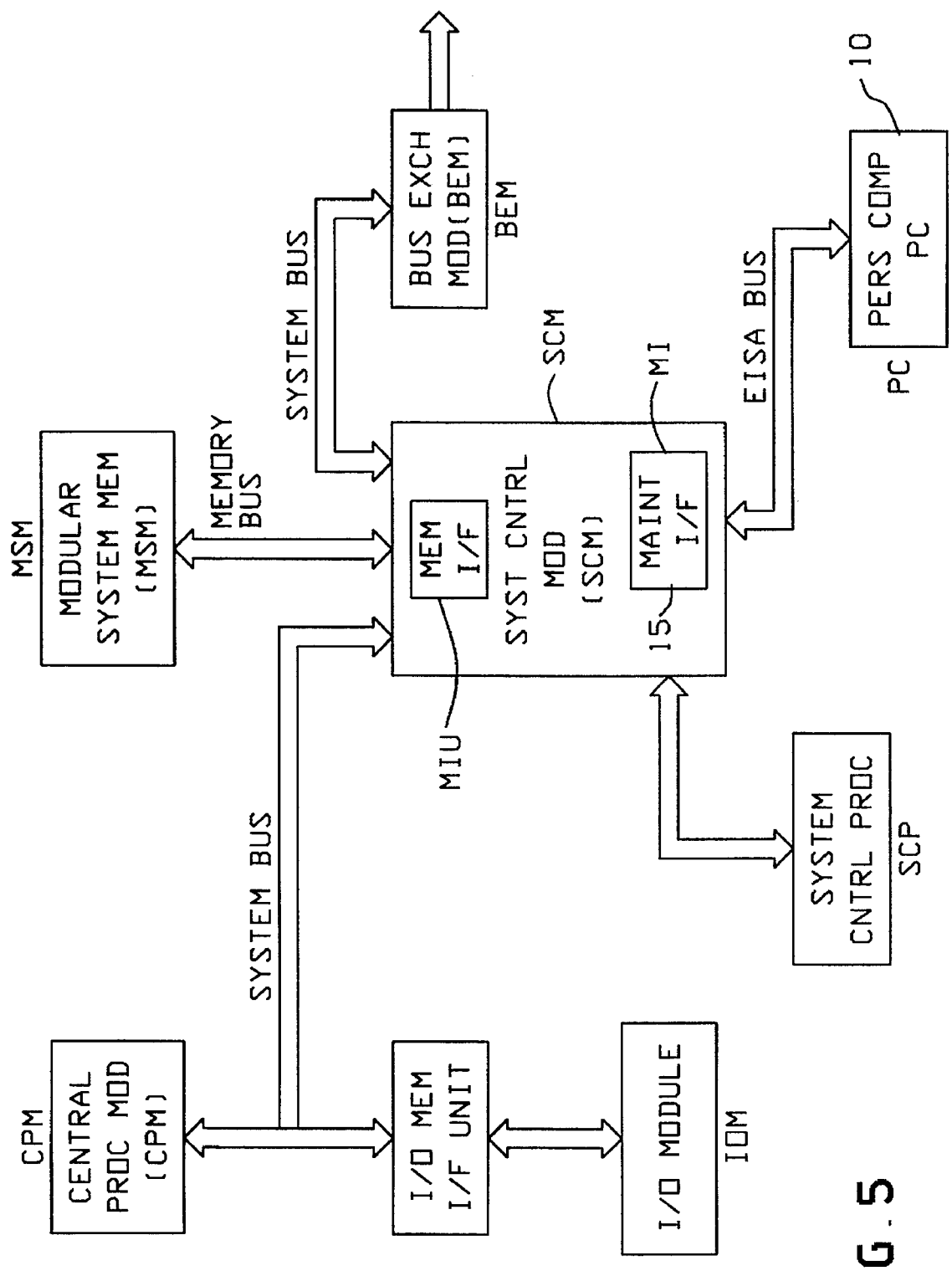
FIG. 5 is a generalized block diagram of a computer system applicable to the use of forward and reverse data transfers.

The Maintenance Interface (MI) Logic 15, FIG. 5, connects to the EISA bus which has connections for control, address and data going to the Shift Interface Control Module 30 and to the Memory Interface and Control Module 300.

The console has a software maintenance interface, and this together with the Maintenance Logic 15 on the SCM (System Control Module) form the maintenance subsystem to provide access and control of all system modules through the SCP's programs.

All registers and data buffers, that facilitate access to the computer "state" conditions, are memory-mapped into the address space used by a SCP program and are accessed by any instruction which performs a memory Read or memory Write operation. The architecture allows simpler software modules to be implemented to control the system during initialization, testing and operations. Additionally, the Maintenance Interface Hardware 15 (MI) provides a mechanism to directly access the E Mode computer memory (MSM) for maintenance or to load boot programs, channel adapter microcode or special stand-alone programs without resorting to shifting module snakes. This mechanism is implemented as a sliding window with automatic address incrementing to assist in multiple consecutive memory accesses.

Figure 2:
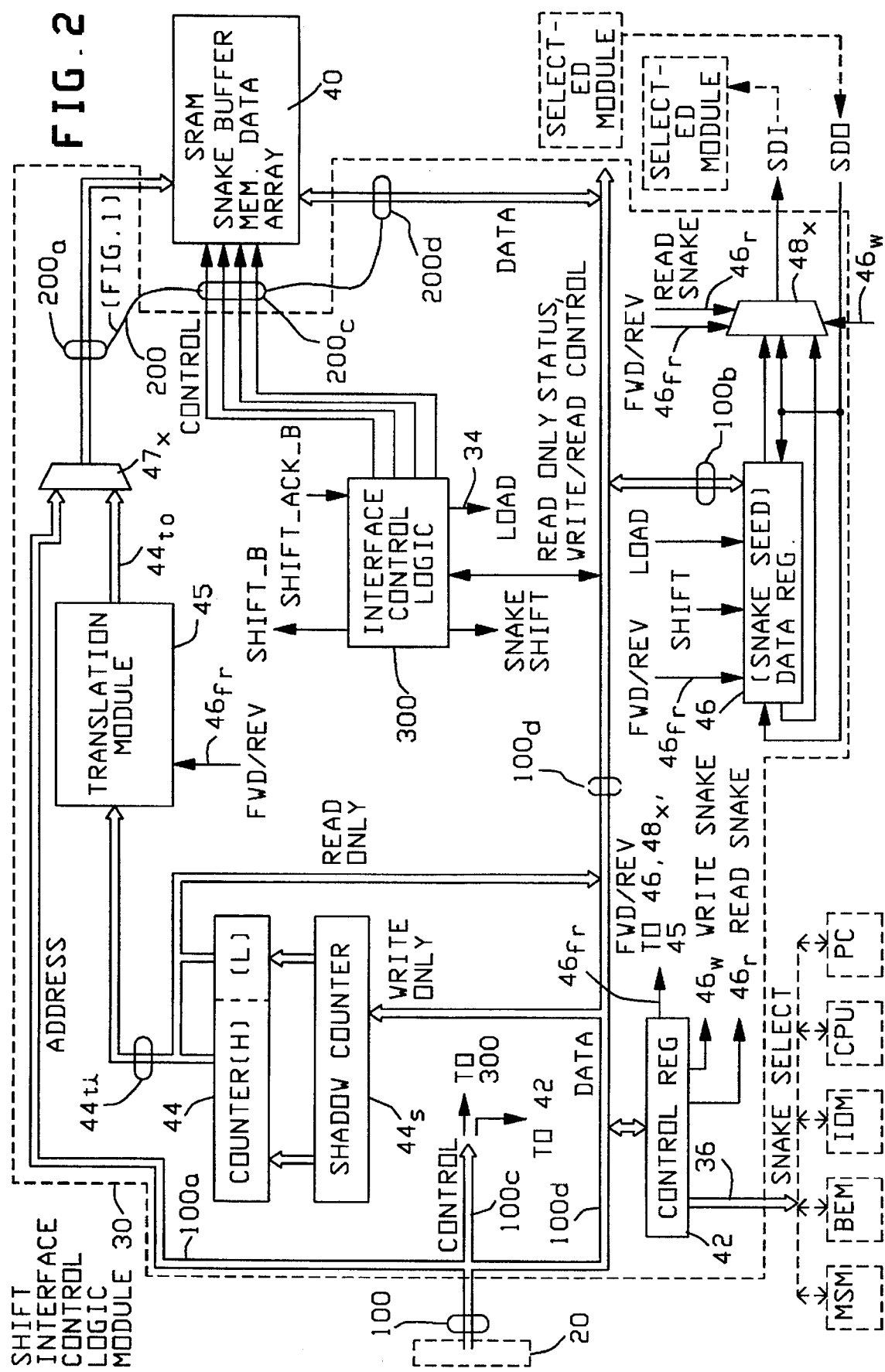
FIG. 2 is a detailed drawing of the Shift Interface Control Logic used for selecting a forward or reverse sequence of characters for data transfer.

A large data buffer 40, FIG. 2 (snake buffer) provided by the Maintenance Interface Hardware 15 (MI) allows the SCP's software to load and manipulate an entire snake for any module. The accessing of the data buffer 40 is accomplished through memory Reads and Writes increasing the program speed of I/O or serial accessing. The size of the buffer allows multiple snake images to be present in the data buffer 40 at any time which can used for either reading or writing.

Maintenance Interface (MI) Hardware Logic 15, FIGS. 1, 2: All registers and functions of the MI logic in the system are accessible through I/O or through memory-mapped instructions of a Maintenance Processor in the SCM, FIG. 5.
I/O Operations All of the low level control of the MI 15 (Maintenance Interface Hardware) is controlled by the SCPs I/O instructions, such as IN and OUT, INS and OUTS, etc. Thus, all the control and status registers are decoded from the I/O part of the EISA bus. The whole I/O space of the EISA bus is 64K bytes or 32K words or 16K double words, and each slot is given a range s000 thru sFFF (hexadecimal) where "s" is the physical slot number into which the board is plugged.
Module Maintenance Bus The controlling software can manipulate the module maintenance signals by using various registers. Once a module (CPM, MIU, MSM, BEM) and one of its snakes has been selected, the Maintenance Interface Hardware 15 (MI)

controls shifting data into or out of the selected snake by controlling the shift signal. The module controls the shifting speed by using the acknowledge signal. When the SCP has finished accessing the state, it may de-select the module. A Maintenance Interface Bus 100, FIG. 2 in shift control logic 30 (FIG. 1) uses a Shift Interface Control and decode module which connects to the bus and provides selection for any of various snakes for connection between SDI and SDO, FIG. 1.

Memory Interface, MIU in SCM, FIG. 5

A program executing in the SCP (System Control Processor) may access any physical location in the MSM memory, FIG. 5, by writing the memory address and the memory command into an command/address register (within Control Register 42 of FIG. 2) in the Maintenance Interface Hardware 15 (MI). If the program wishes to Write, it must first load the data to be written, into the MI 15 Maintenance Interface's Memory Data Register 40 (Snake Buffer, FIGS. 1, 2).

The Maintenance Interface 15 (MI) Memory Logic provides an additional feature if multiple Reads or Writes of multiple consecutive memory addresses are desired. The feature automatically increments the address and issues another memory command after the high-order byte of the data register is accessed. This reduces the number of instructions a program needs to execute in order to Read or Write a contiguous block of the MSM computer memory, FIG. 5.

Shift Chain Interface

The Maintenance Interface Hardware 15 (MI) allows the System Control Processor (SCP) to Write or to Read a shift chain of from 1 to 4080 bits in a single operation. Snakes longer than this can be accessed by repeating the operation, thereby treating the large snake as a series of smaller snakes.

All snake Reads are non-destructive. This is accomplished by routing the data retrieved back to the input of the snake, thereby effectively re-writing the snake with its own data.

Another special feature of the Maintenance Interface Hardware 15 (MI) is that it allows "forward" or "reverse" shifting. This means that the MI hardware can shift a snake that has its MSB (Most Significant Bit) as the first (bit) or the MSB as the last bit, shifted out of it, as seen in FIGS. 3A, 3B.

Write Reverse Snake (FIG. 3B)

For this operation, the snake image is shifted as character "a" (least significant bit, LSB) first, followed by "b", followed by "c", and so on, working upward in memory to the "z" bit (most significant bit, MSB). Thus, the resulting snake will appear as: "a, b, c, d, e . . . v, w, x, y, z" with the "a" and "z" bits representing the LSB and the MSB of the snake, respectively. The data would be shifted out from "right to left", in FIG. 3B and be written into a selected modules such as the IOM, the BEM, the MSM, the CPM, or the PC Module, as seen in FIG. 5.

Read Reverse Snake

For this operation, the snake (FIG. 3B) image from a selected module such as the CPM, MSM, IOM, BEM, PC etc., is shifted out from the snake with "a" first followed by "b" and so on, then storing the information working upward in memory to the "z" bit. The snake will appear to emerge serially as "a, b, c, d, e . . . v, w, x, y, z" with the "a" and "z" bits being the first and last bits to emerge, respectively. The data would be shifted in from right to left. FIG. 3B is illustrative.

Write Forward Snake

For this operation, the snake (FIG. 3B) image is shifted to the target module with "z" first, followed by "y" and then followed by "x" and so on, working downward in memory to the "a" bit. The resulting snake will then appear "z, y, x, w, v . . . e, d, c, b, a" with the "z" and "a" bits representing its MSB and LSB bits, respectively. The data would be shifted out from left to right. FIG. 3A is illustrative.

Read Forward Snake (FIG. 3A)

For this operation, the snake image is shifted out of the snake "z" first, then followed by "y", and then by "x" and so on, thus, storing the information working downward in memory to the "a" bit. The snake will appear to emerge serially as "z, y, x, w, v . . . e, d, c, b, a" with the "z" and "a" bits being the first and last bits to emerge respectively. The data would be shifted in from right to left. FIG. 3A is illustrative.

System Maintenance Bus (composed of bus 36, SDI and SDO busses, SHIFT_B, SHIFT_ACK_B)

The System Maintenance Bus provides a physical and logical connection between the System Control Module (SCM) Maintenance Interface 15 and any other computer module or submodule. The interface 15 allows module testing, initialization, and monitoring to occur at the module's own rate without imposing undue external constraints.

Local System Maintenance Bus

The local maintenance bus signals may be grouped into several categories as follows: Selection, serial shift, interrogation, and reset. Module selection includes selecting a specific module, that is to say, a Central Processing Module (CPM) or a Memory Interface Unit (MIU) or the Bus Exchange Module (BEM) or the Modular System Memory (MSM) and a the selection of a specific shiftable snake within the module. Serial shift signals include the serial datapath and the signals to control shifting by a module. The interrogation signals are single control lines from a module, indicating specific or unique events requiring attention. The reset signals allow the Maintenance Logic to either reset specific modules or submodules or even the entire system.

Module Maintenance Functions

Figure 4:
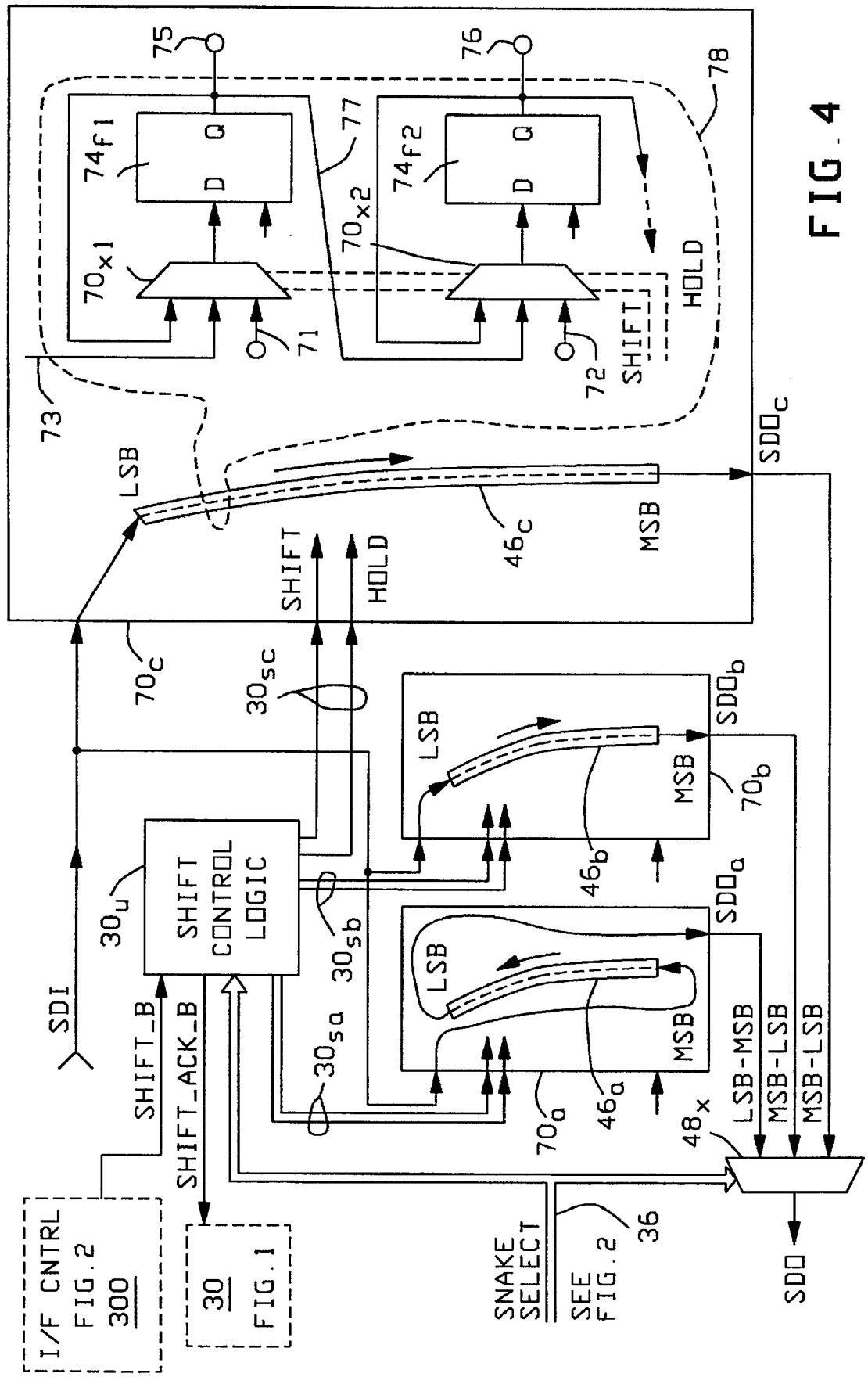
FIG. 4 is a schematic diagram showing snake and snake control circuitry as might exist on a module in the system, such as CPM, MIU, MSM, BEM, as controlled by the Shift Control Logic.

The individual modules maintenance functions are limited to providing at a minimum, address selection decode and shift control logic. The shift control logic $30_u$, FIG. 4, is designed to allow shifting at a rate suitable for the module and not necessarily dependent on the rate of any other module or the SCM's Maintenance Interface Hardware Logic (MI) up to a maximum clock rate of 16 Mhz.

The module must be capable of decoding the snake select lines for a minimum of one snake. In practice, this minimum will be three, that is to say, one for Lights, one for Switches and one for the module's own logic. If a module has more than 16 snakes, it may use its "Switches" to select the remaining snakes.

EISA-to-Maintenance Interface

Low level communication between the System Control Modules (SCM) in a dual cabinet system, whether joined or split, is achieved through a dedicated serial path. Upon command, or upon the detection of a urgent environmental condition, a 24-bit shift chain, containing 8 bits of control and 16 bits of user-definable data, is transferred to another remote System Control Module (SCM) in the other rack. Likewise, the local SCM must be ready to receive the 24 bits from the other SCM for the same reasons.

Shift Control Interface

The SCM's Maintenance Interface Shift Control 30 (FIGS. 1, 2) consists of a "Data" Register 46 (Snake Seed) and also Shift Counter 44 and Control Register 42. The Data Register 46 functions as a bi-directional shift register with parallel Load and Read (Snake Seed 46). This facilitates LSB to MSB snakes when required and also facilitates snakes shifting from MSB to LSB. The Shift Counter 44 and the Control 100c manage control of the SCM-SHIFTM_B signal.

The "Data" Register 46 is loaded with data to be shifted if the command is "shift from buffer" (a Write-type). The Maintenance Interface Hardware (MI) Central Control Logic 300, FIG. 2, decodes the command and fetches data from the SRAM Snake buffer 40 for a Write-type command and loads the "Data" Register 46. Additionally, the Shift Counter 44 is loaded with the length of the snake, from the "Snake-Length" (Shadow Counter) Register $44_s$. Loading the Shift Counter 44 when the command is a "Write" type, causes the Shift Control Logic 300 to drive SCM-SHIFTM-B low.

The direction that data is shifted into or out of the "Data" Register 46 is dependent on bit 15 of the "Snake Number" Register. If this bit is "set", the "Data" Register 46 will shift to the right. Otherwise, the register will shift "left" when a module issues a MI-SHIFT pulse.

DESCRIPTION OF PREFERRED EMBODIMENT

FIG. 1 shows the personal computer, PC 10, connected to the Maintenance Interface Logic 15. The connection is done over the EISA Bus 22 and the Bus Communication Module 20 which is implemented with a Programmable Gate Array (PGA).

A microprocessor 6 in the PC 10, has a bus $6_b$ which handles control, address and data information to and from a memory 12 which can be both a RAM and a ROM. An extended view of the memory 12 is shown as $12_i$ in order to illustrate words composed of data bits in a particular orderly fashion where the "upper" (most significant bit, MSB) level words are indicated as having bits z, y, x, w, v ... and the "lower" (least significant bit) order words are indicated as having bits ... d, c, b, a.

The bus $6_b$ is connected to the EISA bus controller, $20_{bc}$ which controls the EISA Bus 22 and which carries control, address, and data information to the bus communication module 20 in the Maintenance Interface Logic 15.

In FIG. 1, the Maintenance Interface Logic 15 has the EISA Bus Communication Module 20 connected to a Bus 100 which transmits the control, address and data information to and from the Shift Interface Control Logic 30. The Bus 100 is shown in greater detail in FIG. 2 with three portions 100a, 100c and 100d designating address lines, control lines, and data lines.

The Shift Control Interface Logic 30 is connected to a bus 200 which carries control, address and data information to a static RAM (SRAM) 40, which can be designated as a "snake buffer". A extended view of the "internal" memory of SRAM 40 is shown at $40_i$ to show the bits of the upper level words (MSB) and the bits of the lower level (LSB) words which are basically duplicates of the memory insert $12_i$ which resides in RAM Memory 12 of the personal computer, PC 10.

The Shift Interface Control Logic Module 30 is seen to have an input line designated SDO, which designates the "serial data output" from the target snake. The other input to the Shift Interface Control 30 is the signal SHIFT-ACK-B, which comes from the "target" shift control $30_u$ (FIG. 4).

The output signals $30_{sa}$, $30_{sb}$, $30_{sc}$ (FIG. 4) from the Shift Interface Control $30_u$ include the shift signal SHIFT-B and HOLD signal, and SDI the serial data input which is forwarded to the selected module "target" snake, which can be selected as $46_a$, $46_b$, or $46_c$ in the chips $70_a$, $70_b$, $70_c$ (of FIG. 4).

FIG. 2 shows the internal elements of the Shift Interface Control Logic Module 30. In FIG. 2, the Interface Control Logic Module Logic 300 is used to control the Shadow Counter $44_s$ and the Counter 44, in addition to controlling the Snake Buffer 40 and the Data Snake Seed Register 46.

The Control Register 42 connected to the bus 100 can provide a series of output signal lines designated (i) forward/reverse, line $46_{fr}$; (ii) Write snake, $46w$; and (iii) Read snake, line $46_r$. The control lines $46_{fr}$, $46_w$ and $46_r$ are fed to control the multiplexer $48_x$ which receives its inputs from the Data Snake Seed Register 46 starting from "either end" or from the SDO signal. This SBO signal may be seen in FIG. 4 coming from the chips 70a, 70b, and 70c.

The Translation Module 45 of FIG. 2, takes the counter information from counter 44 on to bus $44_{ti}$ and also receives the forward/reverse signals on lines $46_{fr}$ in order to provide an output on bus $44_{to}$ to the multiplexer $47_x$. The output of multiplexer $47_x$ provides an address to the snake buffer 40. The snake buffer 40 communicates, via data bus $200_d$ to carry data to and from the bus 100 as a result of the control signals on bus $200_c$.

The Data Snake Seed Register 46 is a register which enables data from the Snake Buffer 40 to be placed in a desired, orderly arrangement for output on the line designated SDI which feeds to a target snake such as $46_a$, $46_b$, or $46_c$ in chips 70a, 70b, 70c, FIG. 4. This is for a "Snake Write" operation.

The Data Snake Seed Register 46 also retrieves data from the line designated SDO and arranges it for storage in snake buffer 40. This is for a "Snake Read" operation The Data Snake Seed Register 46 is controlled by signals of the forward/reverse line $46_{fr}$, the shift signal (Snake Shift) from Control Logic 300 and the Load Signal 34 from Control Logic 300.

As seen in FIG. 2, the Bus 100 transmits "address" information via $100_a$ to the Multiplexer $47_x$. The Bus 100 transmits data: to the Control Register 42; to the Snake Buffer 40; and to the Data Snake Seed Register 46 by means of the Bus $100_d$.

The Bus 100 carries data: (i) from the Snake Buffer 40; (ii) from the Control Register 42 to the Shadow Counter $44_s$; and (iii) from the Counter 44; and (iv) from the Data Snake Seed Register 46 by means of Bus $100_d$; (v) from Interface Control Logic 300 (Read Status).

The Bus 100 also conveys control signals which are fed to the Interface Control Logic Module 300, to the Control Register 42, to the Snake Buffer 40, and to the Shadow Counter $44_s$.

In FIG. 2, the bus 100 has been split into three subsets designated as the address lines $100_a$, the control lines $100_c$ and the data lines $100_d$.

Likewise, in FIG. 2, the bus 200 (between the snake buffer 40 and the other circuitry, is set up showing the bus 200 as having three sets of lines designated $200_a$, $200_c$ and $200_d$ for address, control, and data transmission.

FIGS. 3A and 3B show a serial snake channel for the transmittal of data received from the PC memory 12 or data to be written to the PC memory 12 as an example of a selected module which could be chosen among the target modules.

The FIG. 3A portion designated "forward" shows that data is fed in (Write) at the input marked SDI and data is fed out (Read) at the portion marked SDO. In the "forward" relationship, it is seen that the most significant bit (MSB) is designated as "z", while the least significant bit (LSB) is designated as the element "a". Thus, the bits z, y, x are the first to be fed in at the SDI input and moved and shifted over to the SDO output end.

The drawing portion, FIG. 3B, shows a "reverse" operation where the least significant bit "a" is fed in first (Write) at the input element SDI and the most significant bit "z" is fed out (Read) last in sequence from the output element SDO.

By use of the system of FIG. 1 and the use of the Interface Control Logic 300 and the Data Snake Seed Register 46 of FIG. 2, there can be provided a series of bits of data either in the forward or in the reverse direction and these can be used for reading operations out of or for writing operations into the PC Memory 12, FIG. 1. Likewise, such serial data bits can be written into or read out of other target module such as the MSM, BEM, IOM, PC, etc.

The EISA Bus Communication Module 20, FIG. 1, provides communication with the EISA Bus 22. The bus communication module 20 of FIG. 1 also provides communication from a rack holding one Maintenance Interface Logic Module 15 into a PC 10. It also provides clock control signals.

In order to enable a "Write" operation of a shift chain, the following sequence of steps is required:

1. The microprocessor 6, FIG. 1, provides a Write command.
2. The microprocessor Writes to the Shadow Counter $44_s$ establishing the length of bits to be shifted.
3. A Write is executed to the Snake Buffer 40 with the data to be written to the selected snake.
4. A Write command is executed to activate the selected snake.
5. Write a command to indicate that the command is valid.
6. Poll the shifting bit in the status register (FIG. 2, Read Only Status from 300) until it becomes "one".
7. Write a command to deactivate the targeted snake.

The following steps are required to enable a "Read" of a selected shift chain:

Items 1, 2 and 4 through 7 are similarly followed, and then following Item 7, the next step involves Reading the Snake Buffer 40 to retrieve the data read out from the selected snake.

In regard to FIG. 4, there is seen a sample chip $70_c$ which indicates the system using one snake chain. In FIG. 4, the Snake Select 36 (from FIG. 2) is fed to the Shift Control Logic $30_u$, FIG. 4, and to the Multiplexer $48_x$, FIG. 2. The Shift Control Logic $30_u$ provides two signals (Shift and Hold) to each of the chips $70_a$, $70_b$ and $70_c$. This is done through the bus lines $30_{sa}$, and $30_{sb}$ and $30_{sc}$ of FIG. 4.

Each of the "chips" $70_a$, $70_b$, and $70_c$ have a snake register designated respectively as register snakes $46_a$, $46_b$, and $46_c$. The shift data input, SDI, is seen feeding to each one of the Snake Registers $46_a$, $46_b$, and $46_c$. Subsequently, the output from each of the chips, designated as $SDO_a$, $SDO_b$, and $SDO_c$ is fed to the multiplexer $48_x$, FIG. 4, which provides the final output designated SDO. Thus, each snake 46 in chips $70_a$, $70_b$, $70_c$ can be selected as a "target snake".

In FIG. 4, the chip unit $70_c$ is provided with an "exploded" or expanded view of the flip-flop mechanisms which constitute the snake $46_c$. This expanded image view of the involved flip-flops is marked as the dotted block 78.

Multiplexers $70_{x1}$ and $70_{x2}$ add shifting and holding functionality to the chip $70_c$'s normal flip-flops $74_{f1}$ and $74_{f2}$ and all others in the snake $46_c$. Each flip-flop in chip $70_c$ has a multiplexer added to it. Lines 75 and 76 are the normal outputs of chip $70_c$'s flip-flops $74_{f1}$ and $74_{f2}$. These lines represent the normal outputs of all flip-flops in chip $70_c$.

Referring to FIG. 4, lines 71 and 72 are the normal inputs to the flip-flops $74_{f1}$ and $74_{f2}$. Lines 73 and 77 carry shifted data through the snake $46_c$ while it is shifting data.

The Shift Control Logic $30_u$ of FIG. 4 and the Interface Control Logic 300 of FIG. 2 are related in that the Shift Control Logic 30 is controlled by the Interface Control Logic 300 using the signal SHIFT-B.

The chip $70_a$ is shown with the snake data $46_a$ functioning with a first sequential output, SDOa of the LSB (least significant bit) and the last sequential input being the MSB (most significant bit).

Chips $70_b$ and $70_c$ are shown with their snake data with a first sequential output (SDO) of the MSB and the last sequential input being the LSB.

These examples illustrate how the Data Snake Seed Register 46 of FIG. 2 can be operated in the forward or reverse sequence to put out bits of data into (Write) or take out of (Read) the target chips 70.

Described herein has been a system for selecting a snake data path which reflects the state condition of various logic circuits in a chip. After selection of the snake path involved, then methods and circuitry are provided for using the snake path to either Write or Read the snake. Control is provided to shift out the data in the selected snake path in a forward or reverse sequence so that the data is shifted out with the most significant bit data first in sequence (forward) or alternatively shifting the least significant bit data first in sequence (reverse).

While a preferred embodiment of the system has been described, it should be understood that other embodiments may be encompassed by the following claims.

What is claimed is:

1. In a network connecting multiple digital modules each having a snake path therethrough wherein a maintenance interface module holds initialization data and serial diagnostic snake data in a memory data array (40), a system for initializing and testing the logic states of logic circuitry in a Selected digital module, comprising:

(a) means to shift data from said memory data array (40) via a data register means (46) into a snake path through said selected digital module;

(b) means to shift said data out of said snake path and into said data register means (46) for transfer to said maintenance interface module for diagnosis;

(c) said data register means including:

(c1) means to select whether data received will be written to said selected digital module in a forward order sequence of most significant bit (MSB) onto least significant bit (LSB) or in a reverse order sequence of LSB onto MSB.

2. The system of claim 1 wherein said data register means includes:

(a) means to select whether data read out from said selected digital module will be transferred to said memory data array in said forward order sequence or in said reverse order sequence.

3. In a network wherein a system control module (SCM) has a maintenance interface means (MI) connected to a plurality of digital modules, a system for regulating the order sequence of data transferred between said maintenance interface and a selected target module, said system comprising:

(a) maintenance interface means (15) including:

(a1) a buffer memory data array (40) for holding data fields in a normal forward order sequence where the most significant bit (MSB) is in the higher order memory location and the least significant bit (LSB) is in the lower order memory location;

(a2) shift interface control logic (30) means for writing a data field into or reading a data field out of said buffer memory data array in the normal forward sequence or in the reverse sequence where the least significant bit (LSB) is in the higher order memory location and the most significant bit (MSB) is in the lower order memory location;

(a3) a data register means (46) for holding a data field received from said buffer memory data array (40) or for holding a data field received from a selected digital target module, said data register means including:

(a3a) means to transfer said data field to a selected target module or to said buffer memory data array in a forward order sequence of MSB to LSB or in a reverse sequence of LSB to MSB;

(a3b) control register means for selecting the said target module and selecting the forward or reverse sequence of data transmission;

(b) said plurality of digital modules connected to said shift interface control logic means (30) and wherein said selected target module can be written to from said data register means (46) or read from said target module to said data register means (46).

4. The system of claim 3 wherein said data field may include software program code and/or a diagnostic snake serial field for testing a selected target module.

5. The system of claim 4 wherein said data register means (46) includes:

(a) a serial snake data input line (SDI) for transmitting said data field to said selected target module;

(b) a serial snake data output line (SDO) for receiving said data field from said selected target module.

6. The system of claim 4 wherein said plurality of digital modules includes a Central Processing Module, an I/O Module, a Memory Storage Module, a Bus Exchange Module, a Personal Computer and said Memory Data Array (40).

7. In a network connecting multiple digital modules each having a snake path for passing data therethrough, wherein a maintenance interface module holds initialization data and serial diagnostic snake data in a memory data array (40), a system for initializing and testing the logic states of logic circuitry in a selected digital module, comprising:

(a) said memory data array (40) for holding said initialization data and serial diagnostic snake data in a normal forward order directional sequence from most significant bit (MSB) to least significant bit (LSB);

(b) means to select a digital module and a set of logic circuitry as a snake path for testing;

(c) means to shift said serial diagnostic snake data via a data register means (46) into said snake path of logic circuitry in said selected digital module and to shift out said snake data into said data register means (46);

(d) said data register means having a holding register for receiving data from said memory data array (40) for transfer to said selected digital module and for receiving data from said selected digital module for transfer to said memory data array (40), and including:

(d1) control means for determining whether said received data is to be written to a selected digital module or said received data is to be read from a selected digital module said control means including:

(d1a) means for directing the sequence of data in said holding register to be transferred in a forward order sequence of MSB to LSB or in a reverse order sequence of LSB to MSB.

8. In a network where a computer having a microprocessor and local memory which holds a sequence of data bits in a normal MSB-LSB orientation, is connected to a Maintenance Interface Logic Unit which initializes and tests various chip modules in the network, and wherein certain modules require a non-normal (LSB-MSB) sequence of data bit orientation placement, while certain chip modules require the normal (MSB-LSB) sequence of data bit orientation placement, a method for initializing said chip modules and testing said chip modules by said maintenance interface logic unit, thus relieving the microprocessor of said operation, said method comprising the steps of:

(a) placing initialization data and diagnostic data into a memory data array of said maintenance interface logic unit, said data being placed in said memory data array in a normal sequence of data bits and in the same data bit sequence as that residing in said local memory;

(b) selecting a target chip module in said network to receive said initialization/test data from said memory data array;

(c) organizing said initialization/test data for transfer to each of said target chip modules selectively according to the requirements of each selected target chip module, said initialization/test data being placed in the normal sequence or in the non-normal sequence according to the requirements of the selected target chip module.

9. The method of claim 8 which includes:

(d) transferring said test data from each of said target chip modules back to said memory data array in order to load said memory data array in the normal data bit sequence which matches the normal data bit sequence of said local memory;

(e) testing said received data in said memory data array in order to check and diagnose each one of said selected chip modules.

* * * * *